(12) United States Patent
Zhao et al.

(10) Patent No.: US 9,923,125 B2
(45) Date of Patent: Mar. 20, 2018

(54) METHOD FOR IMPROVING DEFECT-FREE RATE OF LED LIGHT SOURCE, PHOSPHOR POWDER, AND LED LIGHT SOURCE

(71) Applicant: SICHUAN SUNFOR LIGHT CO., LTD., Sichuan, Chengdu (CN)

(72) Inventors: Kun Zhao, Chengdu (CN); Sen Wang, Chengdu (CN); Wei Luo, Chengdu (CN)

(73) Assignee: Sichuan Sunfor Light Co., Ltd., Chengdu (CN)

(*) Notice: Subject to any disclaimer, the term of this patent is extended or adjusted under 35 U.S.C. 154(b) by 0 days.

(21) Appl. No.: 15/039,319

(22) PCT Filed: Nov. 21, 2014

(86) PCT No.: PCT/CN2014/091897
§ 371 (c)(1),
(2) Date: May 25, 2016

(87) PCT Pub. No.: WO2015/074603
PCT Pub. Date: May 28, 2015

(65) Prior Publication Data
US 2017/0162757 A1 Jun. 8, 2017

(30) Foreign Application Priority Data
Nov. 25, 2013 (CN) .......................... 2013 1 0606855

(51) Int. Cl.
*H01L 33/00* (2010.01)
*H01J 1/62* (2006.01)
*H01L 33/50* (2010.01)

(52) U.S. Cl.
CPC .......... *H01L 33/504* (2013.01); *H01L 33/505* (2013.01); *H01L 33/507* (2013.01); *H01L 2933/0041* (2013.01)

(58) Field of Classification Search
CPC ... H01L 33/504; H01L 33/505; H01L 33/507; H01L 2933/0041
(Continued)

(56) References Cited

U.S. PATENT DOCUMENTS

| 2005/0001532 A1 | 1/2005 | Srivastava et al. |
| 2005/0029929 A1* | 2/2005 | Debray .............. C09K 11/7769 313/503 |

(Continued)

FOREIGN PATENT DOCUMENTS

| CN | 101502174 A | 8/2009 |
| CN | 102549786 A | 7/2012 |

OTHER PUBLICATIONS

International Search Report of International Application No. PCT/CN2014/091897 dated Jan. 28, 2015.

*Primary Examiner* — Dzung Tran
(74) *Attorney, Agent, or Firm* — Michael Ye; Andrews Kurth Kenyon LLP (57) ABSTRACT

A method for improving optical performance of an LED light source, a light conversion filter obtained by using the method, and the corresponding LED light source. In the method, an LED chip is packaged by using a light wavelength conversion component, and the light wavelength conversion component is at least provided with two types of light conversion filters with light excitation performance. With the excitation of light rays that are sent by the LED chip and have wavelengths in an ascending order, sent light rays show an opposite change tendency in light intensities of light rays after the light rays are converted by the two types of light conversion filters. The method can reduce the discrete degree of chroma distribution of light transmitted by the LED light source, and improve the defect-free rate of the LED light source.

12 Claims, 6 Drawing Sheets

(58) Field of Classification Search
USPC ............. 257/98, E25.02, E33.061; 313/503; 438/29; 315/503
See application file for complete search history.

(56) References Cited

U.S. PATENT DOCUMENTS

| | | | |
|---|---|---|---|
| 2005/0200271 A1* | 9/2005 | Juestel | C09K 11/7718 |
| | | | 313/503 |
| 2006/0028122 A1* | 2/2006 | Wang | C09K 11/0883 |
| | | | 313/503 |
| 2006/0045832 A1 | 3/2006 | Nagatomi et al. | |
| 2006/0145123 A1* | 7/2006 | Li | C09K 11/7734 |
| | | | 252/301.4 F |
| 2007/0029526 A1* | 2/2007 | Cheng | C09K 11/7734 |
| | | | 252/301.4 F |
| 2008/0036364 A1* | 2/2008 | Li | C09K 11/7731 |
| | | | 313/503 |
| 2008/0129190 A1 | 6/2008 | Otsuka | |

* cited by examiner

METHOD FOR IMPROVING DEFECT-FREE RATE OF LED LIGHT SOURCE, PHOSPHOR POWDER, AND LED LIGHT SOURCE

The present application is a National Stage Application of PCT/CN2014/091897, filed Nov. 21, 2014, which claims priority of Chinese Patent Application No. 201310606855.4, filed Nov. 25, 2013. The entirety of the aforementioned applications is incorporated herein by reference.

TECHNICAL FIELD

The present invention relates to a method for improving optical performance of an LED light source, a light conversion filter and a corresponding LED light source obtained by using this method. Particularly, the present invention relates to a method which can be applied in LED light sources which are formed by LED chips emitting light of different wavelengths to reduce dispersion degree of chromaticity distribution and improve yield, the light conversion filter (especially phosphor powder) obtained by using the method, and the corresponding LED light source obtained by using the method.

BACKGROUND

LEDs, as advanced light source technologies in lighting field after incandescent lamps and fluorescent lamps, have been widely applied in various fields such as lighting, display and backlights because of advantages like energy conservation, good durability and pollution-free. LEDs have emerged as a new generation of lighting devices. In existing LEDs, a blue light LED chip or an ultraviolet LED chip together with a light conversion filter for converting light emitted from the LED chip realizes emitting of white light or visible light of other colors.

Indexes for evaluating performance of light emitted from an LED light source include chromaticity, color temperature, light efficiency, and color rendering index, and the like. Among the indexes, chromaticity is a key parameter because chromaticity is a physical color for measuring light itself, especially the light visible to human eyes, and human eyes are most sensitive to color differences, and the second, the brightness of different light (light efficiency), cool and warm of light (color temperature), and authenticity of colors (color rending index). If the chromaticity difference of light is too large, i.e., the dispersion degree of the chromaticity distribution is too large, such difference can be perceived by human eyes. This means that such LED light sources have quality discrepancy, and may have a relatively low yield.

People always expect LED light sources having good chromaticity uniformity and high yield, and they divide LED light sources into different levels according to the chromaticity of the light emitted from the LED sources. When manufacturing LED light sources, one or two levels are defined as qualified levels, and LED light sources within these levels are deemed as qualified products, and a ratio between qualified products and a total number of expected products is defined as the yield. And, the LED light sources outside the qualified levels are deemed as unqualified products.

It has been found from long-term studies that the wavelength of the light emitted from an LED chip significantly influences the chromaticity distribution of an LED light source; one type of phosphor powder can emit light having great differences in light properties under excitation of LED chips emitting light of different light wavelengths, especially the chromaticity difference, thereby resulting in the difference in chromaticity distribution of light emitted from different LED light sources. Because the light emitted from LED chips are usually blue light or ultraviolet light (UV) which has a relatively short wavelength, the light property of such light is hard to detect; if the chromaticity distribution of the light emitted from the manufactured LED chips is directly detected, such detection is not accurate.

At present, LED manufacturers generally improve cutting methods of LED chips in order to reduce wavelength differences of light emitted from manufactured LED chips. In addition, in order to obtain LED light sources having relatively small dispersion degree of chromaticity distribution, a patent application No. CN201110036162.7 discloses a method in which the wavelength of light emitted from an LED chip is evaluated by optical performance of light which is emitted from the LED chip and converted by phosphor powder, and the chromaticity distribution of the light emitted from the LED light source is adjusted by adjusting types of the phosphor powder and contents of the phosphor powder so as to improve the yield.

However, in the above method in which improved cutting scheme is used, the LED chips which are outside the qualified levels are not effectively used. In the above method in which phosphor powder is used as the conversion medium, every LED chip has to be checked and then proper phosphor powder can be prepared, and thus the process for manufacturing LED light sources are complicated and thereby the productivity of LED light sources is restricted.

SUMMARY

In view of the above, the present invention provides a method which can be applied in LED light sources which are formed by LED chips emitting light of different wavelengths to reduce dispersion degree of chromaticity distribution and improve yield, a light conversion filter (especially a phosphor) obtained by using the method, and a corresponding LED light source obtained by using the method.

In order to address the above technical problems, the technical solution according to a first aspect of the present invention provides a method for improving yield of an LED light source, including:

packaging an LED chip using a light wavelength conversion member;

wherein the light wavelength conversion member includes at least two light conversion filters having different light excitation properties; and wherein when the at least two light conversion filters having different light excitation properties are excited by light emitted from the LED chip, luminous intensity of light converted by the at least two light conversion filters shows opposing change tendencies as the wavelength of the light emitted from the LED chip changes from short to long.

Preferably, the at least two light conversion filters having different light excitation properties are a light conversion filter having a forward excitation property and a light conversion filter having a reverse excitation property;

when the light conversion filter having the forward excitation property is excited by the light emitted from the LED chip, luminous intensity of light converted by the light conversion filter having the forward excitation property shows a change tendency from weak to strong as the wavelength of the light emitted from the LED chip changes from short to long; and when the light conversion filter having the reverse excitation property is excited by the light emitted from the LED chip, luminous intensity of light converted by the light conversion filter having the reverse excitation property shows a change tendency from strong to weak as the wavelength of the light emitted from the LED chip changes from short to long.

Preferably, the light emitted from the LED chip is ultraviolet light, purple light or blue light.

Preferably, the wavelength of the light emitted from the LED chip is 380 nm to 480 nm.

Preferably, when the light conversion filter having the forward excitation property is excited by the light emitted from the LED chip, the luminous intensity of light converted by the light conversion filter having the forward excitation property shows a change tendency like a straight line or a curved line from weak to strong as the wavelength of the light emitted from the LED chip rises from 380 nm to 480 nm, the straight line has a slope of K1, K1>0, and the curved line has a slope of K2, K2>0.

Preferably, when the light conversion filter having the forward excitation property is excited by the light emitted from the LED chip, the luminous intensity of the light converted by the light conversion filter having the forward excitation property shows a change tendency like a straight line or a curved line from weak to strong as the wavelength of the light emitted from the LED chip rises from 400 nm to 465 nm, the straight line has a slope of K1, K1>0, and the curved line has a slope of K2, K2>0.

Preferably, the slope K1 of the straight line meets a condition: $0.1 \leq K1 \leq 10$, the slope K2 of the curved line is increased or reduced gradually and K2 meets a condition: $0.1 \leq K2 \leq 10$.

Preferably, the slope K1 of the straight line meets a condition: $0.5 \leq K1 \leq 2$, the slope K2 of the curved line is increased or reduced gradually and K2 meets a condition: $0.5 \leq K2 \leq 2$.

Preferably, when the light conversion filter having the reverse excitation property is excited by the light emitted from the LED chip, the luminous intensity of light converted by the light conversion filter having the reverse excitation property shows a change tendency like a straight line or a curved line from strong to weak as the wavelength of the light emitted from the LED chip rises from 380 nm to 480 nm, the straight line has a slope of K1', K1'<0, and the curved line has a slope of K2', K2'<0.

Preferably, when the light conversion filter having the reverse excitation property is excited by the light emitted from the LED chip, the luminous intensity of the light converted by the light conversion filter having the reverse excitation property shows a change tendency like a straight line or a curved line from strong to weak as the wavelength of the light emitted from the LED chip rises from 400 nm to 465 nm, the straight line has a slope of K1', K1'<0, and the curved line has a slope of K2', K2'<0.

Preferably, the slope K1' of the straight line meets a condition: $-10 \leq K1' \leq -0.1$, the slope K2' of the curved line is increased or reduced gradually and K2' meets a condition: $-10 \leq K2' \leq -0.1$.

Preferably, the slope K1' of the straight line meets a condition: $-2 \leq K1' \leq -0.5$, the slope K2' of the curved line is increased or reduced gradually and K2' meets a condition: $-2 \leq K2' \leq -0.5$.

Preferably, a ratio $\alpha$ between weight of the light conversion filter having the forward excitation property and weight of the light conversion filter having the reverse excitation property meets a condition: $1:100 \leq \alpha \leq 100:1$.

Preferably, a ratio $\alpha$ between weight of the light conversion filter having the forward excitation property and weight of the light conversion filter having the reverse excitation property meets a condition: $1:10 \leq \alpha \leq 10:1$.

Preferably, a ratio $\alpha$ between weight of the light conversion filter having the forward excitation property and weight of the light conversion filter having the reverse excitation property meets a condition: $1:2 \leq \alpha \leq 2:1$.

Preferably, when the light conversion filter having the forward excitation property is excited by the light emitted from the LED chip, the luminous intensity of the light converted by the light conversion filter having the forward excitation property shows a change tendency like a straight line or a curved line from weak to strong as the wavelength of the light emitted from the LED chip rises from 380 nm to 480 nm, the straight line has a slope of K1, $0.1 \leq K1 \leq 10$, and the curved line has a slope of K2 which is increased or reduced gradually, $0.1 \leq K2 \leq 10$; when the light conversion filter having the reverse excitation property is excited by the light emitted from the LED chip, the luminous intensity of the light converted by the light conversion filter having the forward excitation property shows a change tendency like a straight line or a curved line from strong to weak as the wavelength of the light emitted from the LED chip rises from 380 nm to 480 nm, the straight line has a slope of K1', $-10 \leq K1' \leq -0.1$, and the curved line has a slope of K2' which is increased or reduced gradually, $-10 \leq K2' \leq -0.1$; a ratio $\alpha$ between weight of the light conversion filter having the forward excitation property and weight of the light conversion filter having the reverse excitation property meets a condition: $1:10 \leq \alpha \leq 10:1$.

Preferably, when an absolute value of any one of K1/K1', K2/K2', K1/K2' or K2/K1' is not less than 1, the ratio $\alpha$ between weight of the light conversion filter having the forward excitation property and weight of the light conversion filter having the reverse excitation property meets a condition: $1:10 \leq \alpha \leq 1:1$; when the absolute value of any one of K1/K1', K2/K2', K1/K2' or K2/K1' is less than 1, the ratio $\alpha$ between weight of the light conversion filter having the forward excitation property and weight of the light conversion filter having the reverse excitation property meets a condition: $1:1 < \alpha \leq 10:1$.

Preferably, in the LED light source, the light wavelength conversion member is disposed on a surface of the LED chip, or is separated from the LED chip.

Preferably, the light conversion filters in the light wavelength conversion member are mixed and then disposed on a surface of the LED chip, or are separated from the LED chip; or the light conversion filters in the light wavelength conversion member are individually disposed on a surface of the LED chip, or are separated from the LED chip.

Preferably, the light emitted from LED light source comprises white light.

Preferably, the light conversion filters are phosphors.

Preferably, the phosphors are phosphor powder.

The technical solution according to a second aspect of the present invention provides a light wavelength conversion member for improving yield of an LED light source, including:

at least two light conversion filters having different light excitation properties;

wherein when the at least two light conversion filters having different light excitation properties are excited by light emitted from an LED chip, luminous intensity of light converted by the at least two light conversion filters show opposing change tendencies as wavelength of the light emitted from the LED chip changes from short to long.

Preferably, the at least two light conversion filters having different light excitation properties are a light conversion filter having a forward excitation property and a light conversion filter having a reverse excitation property;

wherein when the light conversion filter having the forward excitation property is excited by the light emitted from the LED chip, luminous intensity of light converted by the light conversion filter having the forward excitation property shows a change tendency from weak to strong as the wavelength of the light emitted from the LED chip changes from short to long; and wherein when the light conversion filter having the reverse excitation property is excited by the light emitted from the LED chip, luminous intensity of light converted by the light conversion filter having the reverse excitation property shows a change tendency from strong to weak as the wavelength of the light emitted from the LED chip changes from short to long.

Preferably, the light conversion filters are phosphor powder.

Preferably, the light conversion filters comprise phosphor powder having the forward excitation property and phosphor powder having the reverse excitation property; when the phosphor powder having the forward excitation property is excited by the light emitted from the LED chip, the luminous intensity of light converted by the light conversion filter having the forward excitation property shows a change tendency like a straight line or a curved line from weak to strong as the wavelength of the light emitted from the LED chip rises from 380 nm to 480 nm, the straight line has a slope of K1, K1>0, and the curved line has a slope of K2 which is increased or reduced gradually, K2>0;

when the phosphor powder having the reverse excitation property is excited by the light emitted from the LED chip, the luminous intensity of light converted by the light conversion filter having the reverse excitation property shows a change tendency like a straight line or a curved line from strong to weak as the wavelength of the light emitted from the LED chip rises from 380 nm to 480 nm, the straight line has a slope of K1', K1'<0, and the curved line has a slope of K2' which is increased or reduced gradually, K2'<0.

Preferably, absolute values of K1, K1', K2, and K2' range from 0.5 to 2.

Preferably, when the absolute value of any one of K1/K1', K2/K2', K1/K2' or K2/K1' is not less than 1, the ratio α between weight of the phosphor powder having the forward excitation property and weight of the phosphor powder having the reverse excitation property meets a condition: 1:10≤α≤1:1; when the absolute value of any one of K1/K1', K2/K2', K1/K2' or K2/K1' is less than 1, the ratio α between weight of the phosphor powder having the forward excitation property and weight of the phosphor powder having the reverse excitation property meets a condition: 1:1<α≤10:1.

Preferably, the light conversion filter having the forward excitation property is any one selected from aluminate, silicate, and nitride; the light conversion filter having the reverse excitation property is any one selected from aluminate, silicate, and nitride.

The technical solution according to a third aspect of the present invention provides use of the light wavelength conversion member as mentioned above in LED field to reduce dispersion degree of chromaticity distribution of light emitted from an LED device and improve yield of the LED device.

Preferably, the LED device is an LED chip or an LED light source emitting secondary light.

Preferably, the LED light source emitting secondary light is a white LED light source.

Preferably, the LED field comprises LED lighting and LED display.

Preferably, the light wavelength conversion member is applied in the LED field to reduce dispersion degree of color temperature, light efficiency or color rendering index of the light emitted from the LED device.

Technical solution according to a fourth aspect of the present invention provides an LED light source having improved yield, including:
an LED chip; and
a light wavelength conversion member;
wherein the light wavelength conversion member includes at least two light conversion filters having different light excitation properties; and
wherein when the at least two light conversion filters having different light excitation properties are excited by light emitted from the LED chip, luminous intensity of light converted by the at least two light conversion filters shows opposing change tendencies as the wavelength of the light emitted from the LED chip changes from short to long.

Preferably, the at least two light conversion filters having different light excitation properties are a light conversion filter having a forward excitation property and a light conversion filter having a reverse excitation property;

when the light conversion filter having the forward excitation property is excited by the light emitted from the LED chip, luminous intensity of light converted by the light conversion filter having the forward excitation property shows a change tendency from weak to strong as the wavelength of the light emitted from the LED chip changes from short to long; and when the light conversion filter having the reverse excitation property is excited by the light emitted from the LED chip, luminous intensity of light converted by the light conversion filter having the reverse excitation property shows a change tendency from strong to weak as the wavelength of the light emitted from the LED chip changes from short to long.

Figure 11:
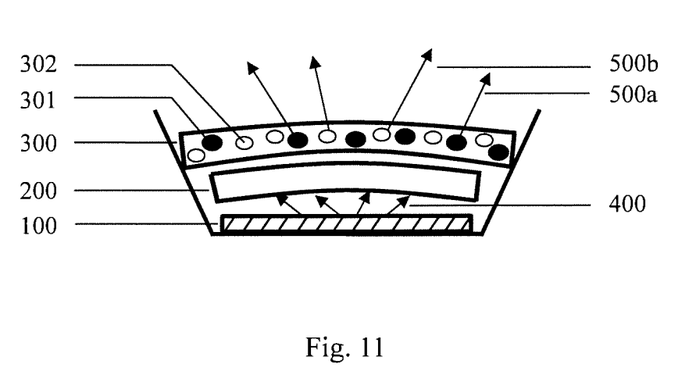
FIG. 11 is a schematic view showing an embodiment according to the fifth aspect of the present invention, where 100 is an LED chip, 200 is a first light wavelength conversion member, 300 is a second light conversion member, 301 is one light conversion filter, 302 is another light conversion filter, and 301 and 302 have different light excitation properties, 400 is an initial light, 500a and 50b are secondary lights converted by two different light conversion filters contained in the second light conversion member, and 500a and 500b show opposing change tendencies as the wavelength of the light emitted from the LED chip changes from short to long.

As shown in FIG. 11, the technical solution according to a fifth aspect of the present invention provides an LED light source device having improved yield, including:
an LED light source emitting secondary light which includes an LED chip and a first light wavelength conversion member; and
a second light wavelength conversion member;
the second light wavelength conversion member includes at least two light conversion filters having different light excitation properties; when the at least two light conversion filters having different light excitation properties are excited by light emitted from the LED chip, luminous intensity of light converted by the at least two light conversion filters shows opposing change tendencies as the wavelength of the light emitted from the LED chip changes from short to long.

Preferably, the at least two light conversion filters having different light excitation properties are a light conversion filter having a forward excitation property and a light conversion filter having a reverse excitation property;

when the light conversion filter having the forward excitation property is excited by the light emitted from the LED chip, luminous intensity of light converted by the light conversion filter having the forward excitation property shows a change tendency from weak to strong as the wavelength of the light emitted from the LED chip changes from short to long; and when the light conversion filter having the reverse excitation property is excited by the light emitted from the LED chip, luminous intensity of light converted by the light conversion filter having the reverse excitation property shows a change tendency from strong to weak as the wavelength of the light emitted from the LED chip changes from short to long.

Preferably, the LED light source emitting secondary light is a white LED light source.

Preferably, the first light wavelength conversion member is any one or more of phosphor powder.

Preferably, the light conversion filters in the second light wavelength conversion member comprises phosphor powder having the forward excitation property and phosphor powder having the reverse excitation property, the phosphor powder having the forward excitation property is any one selected from aluminate, silicate, and nitride, and the phosphor powder having the reverse excitation property is any one selected from aluminate, silicate, and nitride.

The advantages of the present invention over conventional technologies will be described in detail as follows.

The light conversion filter in the present invention may refer to a light wavelength conversion member which can absorb light of a certain wavelength and convert the absorbed light into another wavelength, or a light wavelength conversion member which can absorb and convert a part of light and let the other part of light directly go through. The light conversion filters in the present invention may be luminescence powder which is applied in LEDs. The luminescence powder can be classified into three types: phosphor powder, phosphorescence powder and afterglow luminescence powder.

The change tendency of luminous intensity from weak to strong or from strong to weak in the present invention refers to that, when the light conversion filter having the forward excitation property is excited by the light emitted from the LED chip, the light emitted from the LED chip is converted by the light conversion filter having the forward excitation property, and the luminous intensity of the converted light shows a tendency from weak to strong or from strong to weak (i.e., a gradually increasing or decreasing tendency) as the wavelength of the light emitted from the LED chip changes from short to long. The tendency does not mean that under each excitation wavelength, the luminous intensity of the resulted light after conversion of a corresponding light conversion filter is greater than or less than the luminous intensity of the resulted light after conversion of the light conversion filter under a neighboring shorter wavelength. More precisely, the tendency can be defined as an overall tendency of a set of luminous intensity of obtained light after light emitted from a set of LED chips is converted by the light conversion filters in the present invention, and the overall tendency is that the luminous intensity rises as the wavelength of the light emitted from the LED chips becomes longer or decreases as the wavelength of the light emitted from the LED chips becomes longer.

The LED chips in the present invention are semiconductor devices which do not include the light conversion member (i.e., the luminescence powder).

The LED light source in the present invention may include an LED chip and a light conversion member. The initial light directly emitted from the LED chip, after converted by the light conversion member, becomes secondary light emitted from the LED light source.

The LED device in the present invention refers to the LED chip or the LED light source emitting the secondary light.

The LED light source device in the present invention includes the LED light source emitting the secondary light and a second light wavelength conversion member, the LED light source emitting the secondary light includes an LED chip and a first light wavelength conversion member. The first light wavelength conversion member may be luminescence powder of any type in conventional technologies. The second light wavelength conversion member may be the light wavelength conversion member in the present invention, i.e., the luminescence powder in the present invention which is capable of reducing dispersion degree of chromaticity distribution and improving yield of LEDs.

The light conversion filter having a forward excitation property and the light conversion filter having a reverse excitation property in the present invention are named according to the tendencies of the luminous intensity of the light converted by the light conversion filters when the light conversion filters are excited by light emitted from different LED chips.

The core of the technical solutions in the present invention is, on the basis of LED chips emitting light of different wavelengths under existing conditions for manufacturing LED chips, to provide a method or a product to manufacture LED chips emitting light of different wavelengths into LED light sources of the same target chromaticity level, so that under the same standard measure conditions, the dispersion degree of the chromaticity of the light emitted from the obtained LED light sources is significantly lower than the dispersion degree of the chromaticity of the light emitted from the conventional LED light sources which are obtained by packaging LED chips using a single one or combination of existing light wavelength conversion members, that is, the chromaticity distribution of the former is significantly lower than that of the latter.

To comply with the core of the technical solutions in the present invention, four aspects of technical solutions are provided in the present invention. Although the four aspects of technical solutions are different from each other, the core of the four aspects of solutions is to use a special light wavelength conversion member, i.e., a light wavelength conversion member including at least two light conversion filters having different light excitation properties, wherein when the at least two light conversion filters having different light excitation properties are excited by light emitted from an LED chip, luminous intensity of light converted by the at least two light conversion filters shows opposing change tendencies as the wavelength of the light emitted from the LED chip changes from short to long. Preferably, a light conversion filter having a forward excitation property and a light conversion filter having a reverse excitation property are used. When the light conversion filter having the forward excitation property is excited by the light emitted from the LED chip, luminous intensity of light converted by the light conversion filter having the forward excitation property shows a change tendency from weak to strong as the wavelength of the light emitted from the LED chip changes from short to long. When the light conversion filter having the reverse excitation property is excited by the light emitted from the LED chip, luminous intensity of light converted by the light conversion filter having the reverse excitation property shows a change tendency from strong to weak as the wavelength of the light emitted from the LED chip changes from short to long.

As well known by one of ordinary skill in this art, when semiconductor layers in different LED chips convert electrical energy into light energy, there are differences in the wavelengths of the emitted light; LED chips in the same batch manufactured by the same production line may even have the same problem. When the LED chips which emit light of different wavelengths are packaged using light wavelength conversion members (usually phosphors) of the same color scheme or even the same color to form finalized LED light sources, even though the color conversions of the phosphors are the same, the chromaticity values of the light emitted from the LED light sources have differences because of the difference in the wavelengths of the light emitted from the LED chips, and thus unqualified products which have a chromaticity far departing from a target chromaticity usually appear. Sometimes, human eyes can perceive such chromaticity differences. Thus, this problem becomes a bottle-neck which restricts productivity of LED manufactures.

In the present invention, the method for improving yield of an LED light source or the light wavelength conversion member uses the light special wavelength conversion member provided by the present invention. The technical solutions in the present invention mainly use two light conversion filters having opposing light excitation properties to balance the light obtained by excitation of light having a long wavelength and the light obtained by excitation of light having a short wavelength. No matter the light emitted from LED chips is within a long wavelength band or a short wavelength band, the light will be absorbed and converted by the two light conversion filters, and the light can be emitted after different conversions (for example, luminous intensity of converted light changes from weak to strong, or from strong to weak as the wavelength of the light emitted from the LED chips changes from short to long), and thus the balancing on the chromaticity is realized. If only the light conversion filter having the forward excitation property or the light conversion filter having the reverse excitation property is employed, the light having a wavelength in the low wavelength band emitted from the LED chips can be converted into light which is of one type of luminous intensity, the light having a wavelength in the short wavelength band emitted from the LED chips can be converted into light which is of only one type of luminous intensity, and there are great differences between the two converted light, thereby resulting in great chromaticity difference in the light emitted from the LED light sources.

Further, on the basis of the above core technical solutions, the present invention further provides preferable technical solutions. For example, when the wavelength of the excitation light is in a particular range, or when an inclination angle, or a slope or a curved-line slop of the tendency of the luminous intensity of the light which is excited and then converted is within a particular range, range or standard deviation of chromaticity can be further reduced, i.e., LED light sources belonging to the same color scheme which have reduced dispersion degree of chromaticity distribution can be obtained. For example, the range of chromaticity can be reduced by 30% or 50% or more, and the standard deviation of chromaticity can be reduced by 40% or 60% or more.

Further, the wavelength conversion member in the present invention may be directly applied on an LED chip to manufacture an LED light source, may also be used for chromaticity adjustment when applied in existing LED light sources, and may be manufactured as a compensation device for an LED light source to adjust the chromaticity of an LED light source light of which has been converted by phosphors.

Further, in the method or light wavelength conversion member in the technical solutions of the present invention, the light excitation property of the light conversion filters is further adjusted, for example, adjustments of the inclination angle, the slope or the straight-line slope of the light conversion tendency, the color or the amount of the used light conversion filters, and thus LED light sources having relatively small dispersion degree of light properties such as color temperature, light efficiency or color rendering indexes can be obtained. Consequently, the ratio of finalized LED light sources falling into the target light property level is further increased.

DETAILED DESCRIPTION

In order to make one of ordinary skill in this art well understand the technical solutions of the present invention, the present invention will be described below in detail with reference to specific embodiments.

First Embodiment—Experimental Measurements on Chromaticity Distribution

A light wavelength conversion member according to an embodiment of the present invention may be prepared according to the following Tables 1 and 2. The light wavelength conversion member is obtained by physically mixing various light conversion filters (for example, phosphors), or by film formation or fluid dispensing, or by laminating various light conversion filters at periphery of a light-emitting surface of an LED chip. The light wavelength conversion member obtained by mixing or various light conversion filters may be disposed on a surface of an LED chip or may be separated from the LED chip. And, existing approaches for preparing LED light sources such as film formation, fluid dispensing or coating can be employed herein.

The LED chips used in the present invention may be LED chips emitting blue light, ultraviolet light, or purple light, or may be LED chips emitting light of wavelengths ranging from 380 nm to 480 nm, preferably 400 nm to 465 nm. The target color of the light emitted from the finalized LED light sources may be light having colors in the visible range, or may be white light. The color of the phosphor powder may be selected according to actual requirements. In the first embodiment, a combination of blue LED chip+yellow phosphor powder is used to complete the experimental measurements, but the present invention is not limited to this, and the scope of the present invention shall be defined by the embodiments set forth below, the contents as disclosed in the summary portion and the equivalents which can be reasonably arrived at based on common knowledge in this art.

The LED chips used in the first embodiment include an LED chip emitting light of a wavelength ranging from 380 nm to 480 nm and an LED chip emitting light of a wavelength ranging from 400 nm to 465 nm, and the light conversion filters used in the first embodiment are yellow phosphor powder as listed below.

A': product No. CCFL-B bought from Intematix Corporation (When the phosphor powder A' is excited by the light emitted from an LED chip, the light conversion tendency appears to be a straight line, changing from weak to strong, as the wavelength of the light emitted from the LED chip changes from 380 nm to 480 nm. The slope of the straight line is 0.1.)

B': aluminate, product No. XLLY-03B bought from Sunfor Light Co., Ltd.

(When the phosphor powder B' is excited by the light emitted from an LED chip, the light conversion tendency appears to be a straight line, changing from weak to strong, as the wavelength of the light emitted from the LED chip changes from 380 nm to 480 nm. The slope of the straight line is 10.)

C': aluminate, product No. XLLY-04B bought from Sunfor Light Co., Ltd.

(When the phosphor powder C' is excited by the light emitted from an LED chip, the light conversion tendency appears to be a curved line, changing from weak to strong, as the wavelength of the light emitted from the LED chip changes from 380 nm to 480 nm. The slope of the curved line is increased gradually from 0.1 to 10.)

D': aluminate, product No. XLLY-06B bought from Sunfor Light Co., Ltd.

(When the phosphor powder D' is excited by the light emitted from an LED chip, the light conversion tendency appears to be a curved line, changing from weak to strong, as the wavelength of the light emitted from the LED chip changes from 380 nm to 480 nm. The slope of the curved line is decreased gradually from 10 to 0.1.)

E': silicate, product No. Y3957 bought from Intematix Corporation (When the phosphor powder E' is excited by the light emitted from an LED chip, the light conversion tendency appears to be a straight line, changing from strong to weak, as the wavelength of the light emitted from the LED chip changes from 380 nm to 480 nm. The slope of the straight line is −0.1.)

F': silicate, product No. Y4651 bought from Intematix Corporation (When the phosphor powder F' is excited by the light emitted from an LED chip, the light conversion tendency appears to be a straight line, changing from strong to weak, as the wavelength of the light emitted from the LED chip changes from 380 nm to 480 nm. The slope of the straight line is −10.)

G': silicate, product No. Y4750 bought from Intematix Corporation (When the phosphor powder G' is excited by the light emitted from an LED chip, the light conversion tendency appears to be a curved line, changing from strong to weak, as the wavelength of the light emitted from the LED chip changes from 380 nm to 480 nm. The slope of the curved line is increased gradually from −10 to −0.1.)

H': nitride, LMH-102, bought from Mitsubishi (When the phosphor powder H' is excited by the light emitted from an LED chip, the light conversion tendency appears to be a curved line, changing from strong to weak, as the wavelength of the light emitted from the LED chip changes from 380 nm to 480 nm. The slope of the curved line is decreased gradually from −0.1 to −10.)

A: $Y_3Al_5O_{12}$:Ce, product No. XLLY-01A bought from Sunfor Light Co., Ltd.

(When the phosphor powder A is excited by the light emitted from an LED chip, the light conversion tendency appears to be a straight line, changing from weak to strong, as the wavelength of the light emitted from the LED chip changes from 400 nm to 465 nm. The slope of the straight line is 0.5.)

B: $Lu_3Al_5O_{12}$:Ce, product No. XLLY-13-15 bought from Sunfor Light Co., Ltd.

(When the phosphor powder B is excited by the light emitted from an LED chip, the light conversion tendency appears to be a straight line, changing from weak to strong, as the wavelength of the light emitted from the LED chip changes from 400 nm to 465 nm. The slope of the straight line is 2.)

C: $Y_3Al_5Ga_3O_{12}$:Ce, product No. 3957 bought from Hung Ta Trading Co., Ltd.

(When the phosphor powder C is excited by the light emitted from an LED chip, the light conversion tendency appears to be a curved line, changing from weak to strong, as the wavelength of the light emitted from the LED chip changes from 400 nm to 465 nm. The slope of the curved line is increased gradually from 0.5 to 2.)

D: $YGd_2Al_5O_{12}$:Ce, product No. SMD-02 bought from General Research Institute of Nonferrous Metals.

(When the phosphor powder D is excited by the light emitted from an LED chip, the light conversion tendency appears to be a curved line, changing from weak to strong, as the wavelength of the light emitted from the LED chip changes from 400 nm to 465 nm. The slope of the curved line is decreased gradually from 2 to 0.5.)

E: silicate $Ba_2SiO_4$:Eu, product No. G2762 bought from Intematix Corporation (When the phosphor powder E is excited by the light emitted from an LED chip, the light conversion tendency appears to be a straight line, changing from strong to weak, as the wavelength of the light emitted from the LED chip changes from 400 nm to 465 nm. The slope of the straight line is −0.5.)

F: silicate $Sr_3SiO_5$:Eu, product No. 05742 bought from Intematix Corporation (When the phosphor powder F is excited by the light emitted from an LED chip, the light conversion tendency appears to be a straight line, changing from strong to weak, as the wavelength of the light emitted from the LED chip changes from 400 nm to 465 nm. The slope of the straight line is −2.)

G: nitride $Sr_2Si_5N_8$:Eu, product No. XLLYR-63B bought from Sunfor Light Co., Ltd.

(When the phosphor powder G is excited by the light emitted from an LED chip, the light conversion tendency appears to be a curved line, changing from strong to weak, as the wavelength of the light emitted from the LED chip changes from 400 nm to 465 nm. The slope of the curved line is increased gradually from −2 to −0.5.)

H: nitride $SrAlSiN_3$:Eu, product No. 0763 bought from Intematix Corporation (When the phosphor powder H is excited by the light emitted from an LED chip, the light conversion tendency appears to be a curved line, changing from strong to weak, as the wavelength of the light emitted from the LED chip changes from 400 nm to 465 nm. The slope of the curved line is decreased gradually from −0.5 to −2.)

Figure 1:
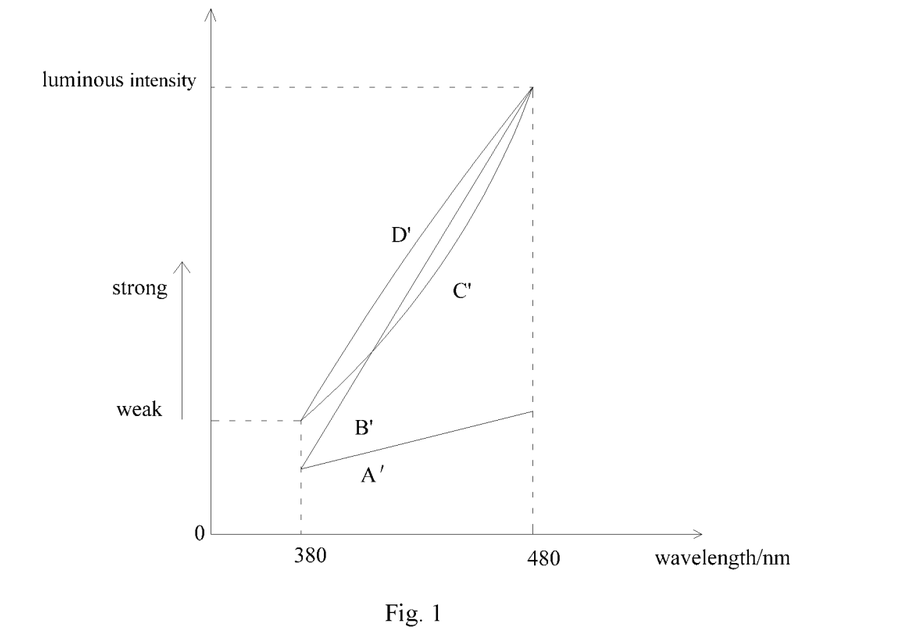
FIG. 1 shows change tendencies of luminous intensity of light converted by light conversion filters A'-D' having a forward excitation property in a light wavelength conversion member according to an embodiment of the present invention, when the light conversion filters A'-D' are excited by light of different wavelengths emitted from LED chips.
Figure 2:
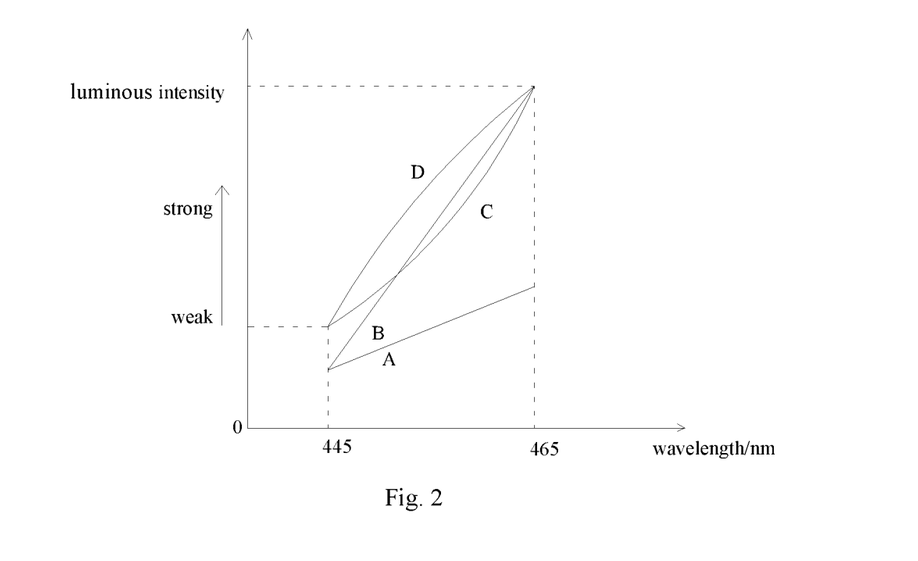
FIG. 2 shows change tendencies of luminous intensity of light converted by light conversion filters A-D having a forward excitation property in a light wavelength conversion member according to an embodiment of the present invention, when the light conversion filters A-D are excited by light of different wavelengths emitted from LED chips.
Figure 3:
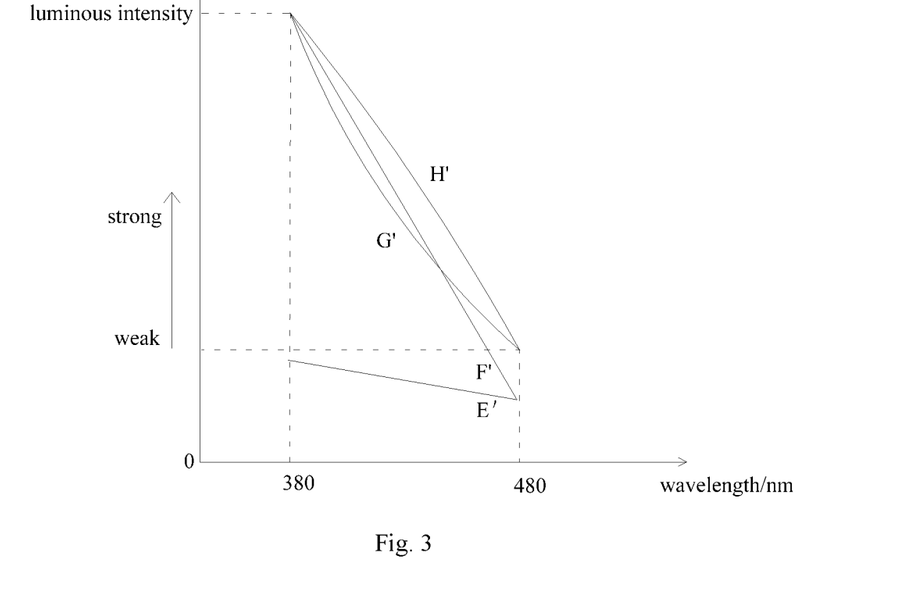
FIG. 3 shows change tendencies of luminous intensity of light converted by light conversion filters E'-H' having a reverse excitation property in a light wavelength conversion member according to an embodiment of the present invention, when the light conversion filters E'-H' are excited by light of different wavelengths emitted from LED chips.
Figure 4:
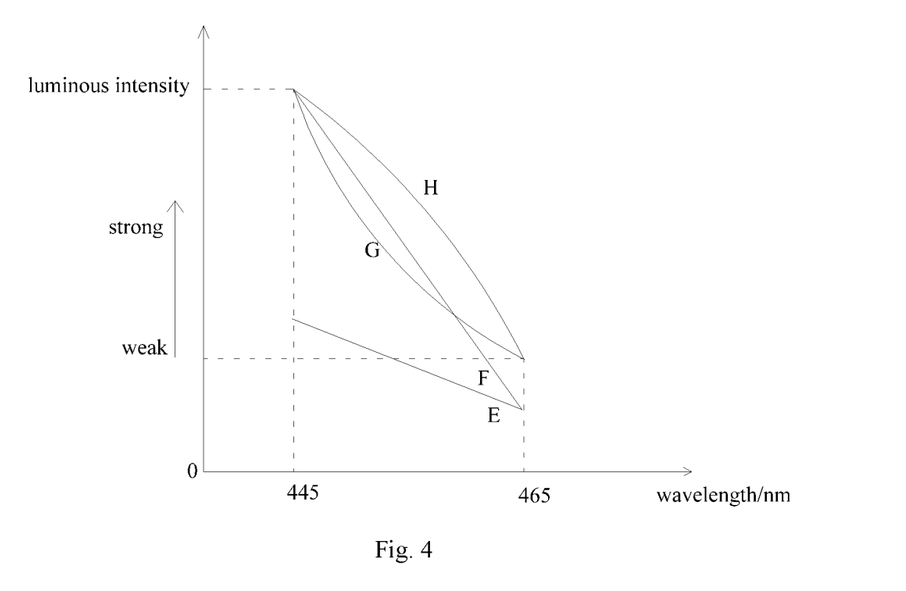
FIG. 4 shows change tendencies of luminous intensity of light converted by light conversion filters E-H having a reverse excitation property in a light wavelength conversion member according to an embodiment of the present invention, when the light conversion filters E-H are excited by light of different wavelengths emitted from LED chips.

When the phosphor powder A' to D' and A to D is excited by the light emitted from an LED chip, the luminous intensity of the light converted by the phosphor powder A' to D' and A to D shows a change tendency from weak to strong. The conversion tendencies of phosphor powder A' to D' and A to D are as shown in FIGS. 1 and 2. When the phosphor powder E' to H' and E to H is excited by the light emitted from an LED chip, the luminous intensity of the light converted by the phosphor powder E' to H' and E to H shows a change tendency from strong to weak. The conversion tendencies of phosphor powder E' to H' and E to H are as shown in FIGS. 3 and 4.

Figure 5:
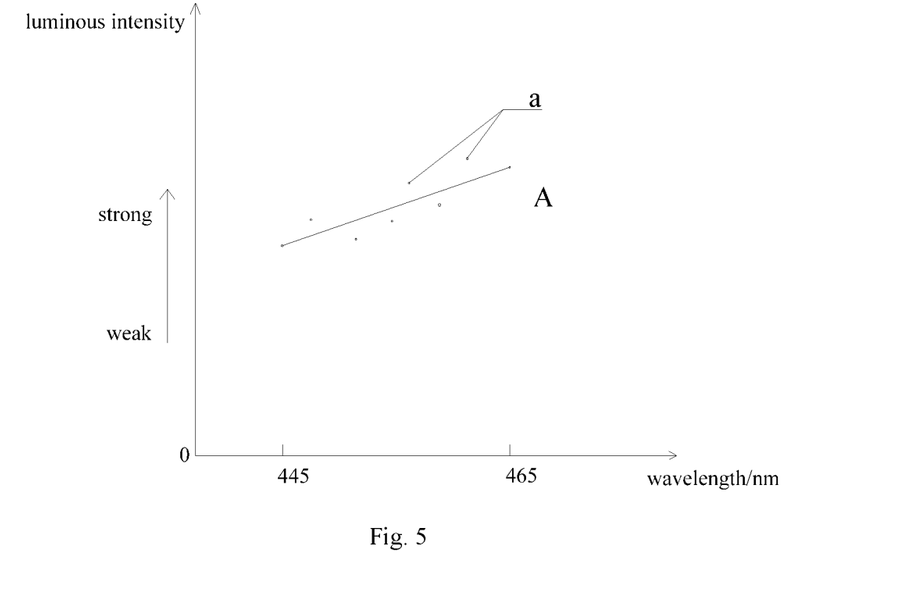
FIGS. 5-8 is a graph showing change tendencies of luminous intensity of light converted by light conversion filters having a reverse excitation property in a light wavelength conversion member as shown in FIG. 2, when the light conversion filters are excited by light of different wavelengths emitted from LED chips.
Figure 6:
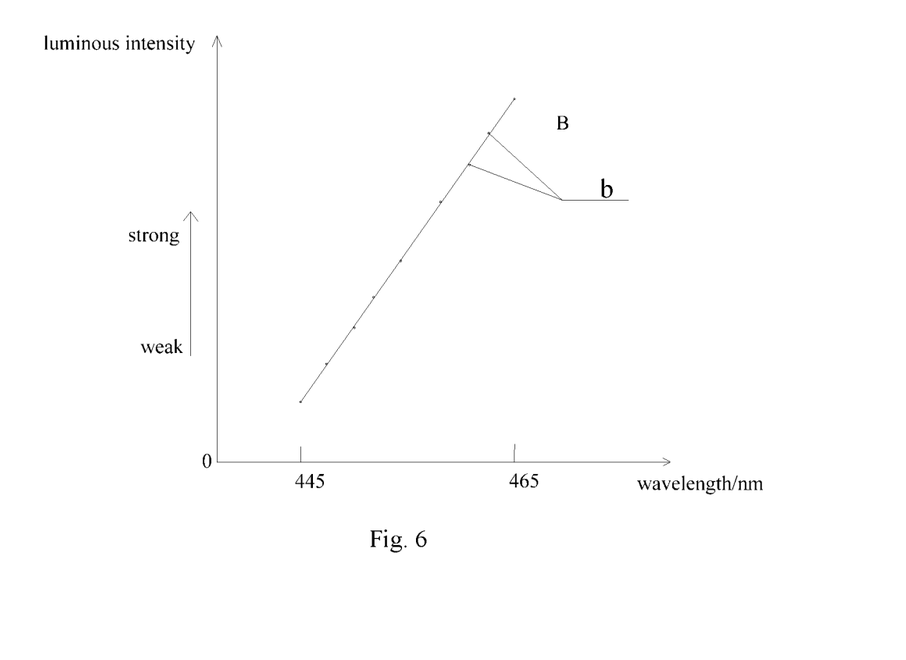
Figure 7:
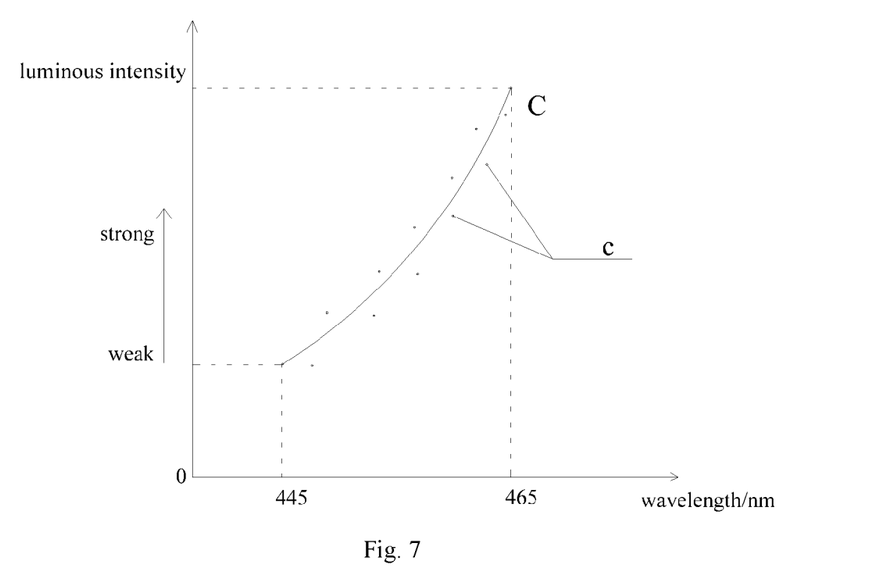
Figure 8:
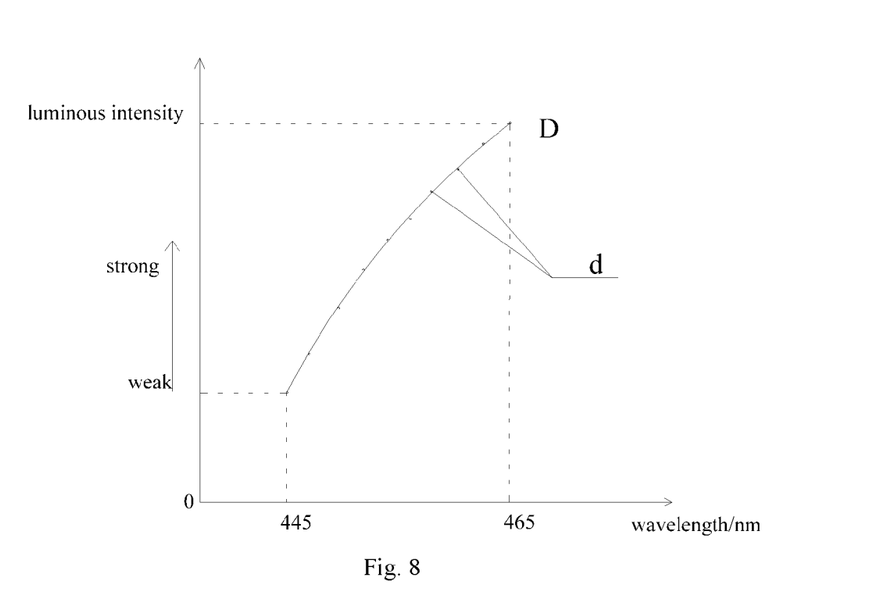

FIGS. 5 to 8 are graphs showing change tendencies of light conversion of light conversion filters, for example A-D, as the wavelength of the light emitted from the LED chip rises. In the figure, a, b, c and d represent values of luminous intensity of light converted by light conversion filters A, B, C and D as the wavelength of the light emitted from the LED chip gradually rises, when the light conversion filters A-D are excited by the light emitted from the LED chip. The values of the luminous intensity as shown in FIGS. 5 and 7 are not all on the straight line or the curved line which reflects the overall tendency of the whole set of values, but are distributed at both sides of the straight line or the curved line. The overall tendency of the whole set of data appears to be a straight line or a curved line. Most of the values of the luminous intensity as shown in FIGS. 6 and 8 are concentrated on the straight line or the curved line which reflects the overall tendency of the whole set of values.

In the following Table 1, the weight ratio of respective phosphor powder for preparing the light wavelength conversion member which includes two or more phosphor powder is 1:1, 1:1:1 or 1:1:1:1, and the amount of the light wavelength conversion member may be usual amount when commonly used phosphor powder is applied onto LED chips to manufacture LED light sources.

TABLE 1

Phosphors in Light Wavelength Conversion Member

| wavelength conversion members | A' | B' | C' | D' | E' | F' | G' | H' |
|---|---|---|---|---|---|---|---|---|
| 1' | + | − | − | − | − | − | − | − |
| 2' | − | + | − | − | − | − | − | − |
| 3' | − | − | − | − | + | − | − | − |
| 4' | − | − | − | − | − | + | − | − |
| 5' | + | − | − | − | + | − | − | − |
| 6' | − | + | − | − | − | + | − | − |
| 7' | − | − | + | − | − | − | + | − |
| 8' | − | − | − | + | − | − | − | + |
| 9' | + | − | − | − | − | − | − | + |
| 10' | − | − | − | + | + | − | − | − |
| 11' | + | − | + | − | + | − | − | + |
| 12' | − | + | − | + | − | + | + | − |
| 13' | − | − | + | − | + | − | + | − |

TABLE 2

Phosphors in Light Wavelength Conversion Member

| wavelength conversion members | A | B | C | D | E | F | G | H |
|---|---|---|---|---|---|---|---|---|
| 1 | + | − | − | − | − | − | − | − |
| 2 | − | + | − | − | − | − | − | − |
| 3 | − | − | − | − | + | − | − | − |
| 4 | − | − | − | − | − | + | − | − |
| 5 | + | − | − | − | + | − | − | − |
| 6 | − | + | − | − | − | + | − | − |
| 7 | − | − | + | − | − | − | + | − |
| 8 | − | − | − | + | − | − | − | + |
| 9 | + | − | − | − | − | − | − | + |
| 10 | − | − | − | + | + | − | − | − |
| 11 | + | − | + | − | + | − | − | + |
| 12 | − | + | − | + | − | + | + | − |
| 13 | − | − | + | − | + | − | + | − |

In the above tables, "−" indicates not including a phosphor, and "+" indicates including a phosphor.

Figure 9:
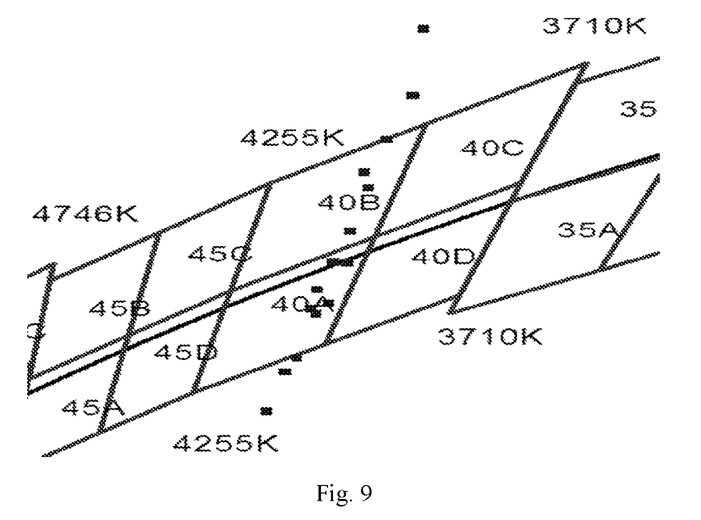
FIG. 9 is a graph showing chromaticity distribution of LED light sources which are manufactured using an existing light wavelength conversion member.
Figure 10:
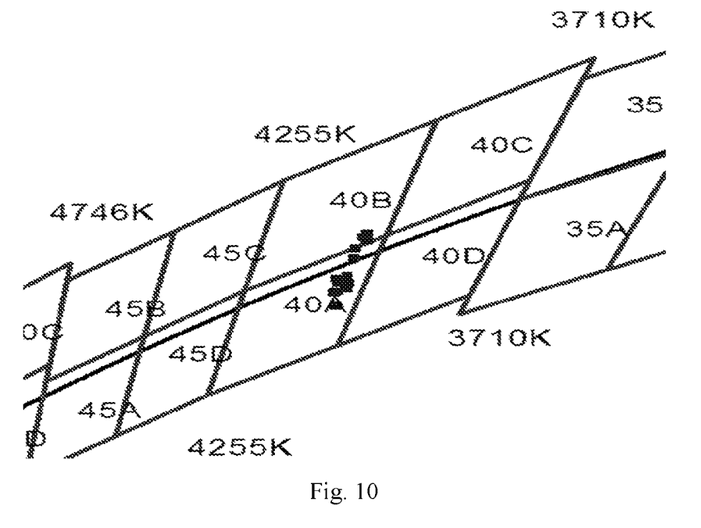
FIG. 10 is a graph showing chromaticity distribution of LED light sources which are manufactured using a light wavelength conversion member according to an embodiment of the present invention.

The above light wavelength conversion members may be applied onto and packaged with LED chips in the same batch manufactured by the same production line. The packaging method may be dispensing the light wavelength conversion members on respective LED chips by fluid dispensing, or disposing the light wavelength conversion members at periphery of light-emitting surfaces of respective LED chips by film formation or coating, and the like. No matter the light wavelength conversion members are disposed on the LED chips or separated from the LED chips, chromaticity values of white light LED light sources which are obtained by applying the light wavelength conversion members as listed in Tables 1 and 2 onto LED chips which emit light having a wavelength from 380 nm to 480 nm and LED chips which emit light having a wavelength from 400 nm to 465 nm are measured. The measurement method is based on GB/T 24982-2010 "Rare Earth Yellow Phosphor for White LED Lamps". The measurement results are shown in FIGS. 9 and 10. FIG. 9 is a graph showing chromaticity distribution of a series of LED light sources which are manufactured using a light wavelength conversion member 1, and FIG. 10 is a graph showing chromaticity distribution of a series of LED light sources which are manufactured using a light wavelength conversion member 7. As can be seen from FIGS. 9 and 10, by using the light wavelength conversion members in the present invention, the range of chromaticity values of the light emitted from the LED light sources in the same batch which are manufactured by the same production line can be effectively reduced, so that the chromaticity values of the LED light sources can fall within levels of predetermined ranges, that is, the chromaticity distribution of the light emitted from the LED light sources can be reduced, and thereby product yield of the LED light sources is improved. Further, the light wavelength conversion members 1-13 are applied onto LED chips to manufacture LED light sources of the same target chromaticity. The measured chromaticity values, range values and standard deviations of the light emitted from the obtained LED light sources are listed in the following tables.

TABLE 3

Experimental Measurements on Chromaticity Distribution (light wavelength conversion members 1'-3' + LED chips having a wavelength from 380 nm to 480 nm)

| emitting wavelengths from chips | wavelength conversion members | | | | | |
|---|---|---|---|---|---|---|
| | 1' | | 2' | | 3' | |
| | x | y | x | y | x | y |
| 380-395 nm | 0.3762 | 0.3629 | 0.3752 | 0.3593 | 0.3759 | 0.3612 |
| 395-405 nm | 0.3767 | 0.3663 | 0.3766 | 0.3661 | 0.3777 | 0.3689 |
| 405-415 nm | 0.3776 | 0.3710 | 0.3769 | 0.3749 | 0.3745 | 0.3569 |
| 415-430 nm | 0.3794 | 0.3784 | 0.3794 | 0.3763 | 0.3814 | 0.3830 |
| 430-445 nm | 0.3783 | 0.3746 | 0.3784 | 0.3757 | 0.3795 | 0.3748 |
| 445-455 nm | 0.3804 | 0.3833 | 0.3812 | 0.3854 | 0.3860 | 0.4018 |
| 455-465 nm | 0.3812 | 0.3881 | 0.3828 | 0.3891 | 0.3841 | 0.3926 |
| 465-480 nm | 0.3826 | 0.3926 | 0.3847 | 0.3983 | 0.3852 | 0.3976 |
| average values | 0.37904 | 0.37716 | 0.37939 | 0.37815 | 0.38055 | 0.37960 |
| range | 0.0064 | 0.0297 | 0.0095 | 0.0390 | 0.0115 | 0.0449 |
| standard deviations | 0.00225 | 0.01045 | 0.00329 | 0.01253 | 0.00434 | 0.01686 |

TABLE 4

Experimental Measurements on Chromaticity Distribution (light wavelength conversion members 4'-6' + LED chips having a wavelength from 380 nm to 480 nm)

| emitting wavelengths from chips | wavelength conversion members | | | | | |
|---|---|---|---|---|---|---|
| | 4' | | 5' | | 6' | |
| | x | y | x | y | x | y |
| 380-395 nm | 0.3753 | 0.3619 | 0.3798 | 0.3767 | 0.3790 | 0.3744 |
| 395-405 nm | 0.3774 | 0.3684 | 0.3801 | 0.3782 | 0.3792 | 0.3728 |
| 405-415 nm | 0.3788 | 0.3748 | 0.3781 | 0.3719 | 0.3787 | 0.3732 |
| 415-430 nm | 0.3794 | 0.3805 | 0.3779 | 0.3702 | 0.3786 | 0.3717 |
| 430-445 nm | 0.3782 | 0.3727 | 0.3790 | 0.3744 | 0.3794 | 0.3750 |
| 445-455 nm | 0.3811 | 0.3871 | 0.3786 | 0.3730 | 0.3779 | 0.3712 |
| 455-465 nm | 0.3852 | 0.3983 | 0.3809 | 0.3805 | 0.3805 | 0.3793 |
| 465-480 nm | 0.3792 | 0.3778 | 0.3793 | 0.3752 | 0.3809 | 0.3787 |
| average values | 0.37931 | 0.37769 | 0.37922 | 0.37499 | 0.37928 | 0.37453 |
| range | 0.0100 | 0.0364 | 0.0029 | 0.0103 | 0.0029 | 0.0081 |
| standard deviations | 0.00293 | 0.01128 | 0.00101 | 0.00339 | 0.00099 | 0.00303 |

TABLE 5

Experimental Measurements on Chromaticity Distribution (light wavelength conversion members 7'-9' + LED chips having a wavelength from 380 nm to 480 nm)

| emitting wavelengths from chips | wavelength conversion members | | | | | |
|---|---|---|---|---|---|---|
| | 7' | | 8' | | 9' | |
| | x | y | x | y | x | y |
| 380-395 nm | 0.3794 | 0.3754 | 0.3797 | 0.3769 | 0.3765 | 0.3670 |
| 395-405 nm | 0.3787 | 0.3729 | 0.3783 | 0.3723 | 0.3768 | 0.3691 |
| 405-415 nm | 0.3787 | 0.3739 | 0.3789 | 0.3743 | 0.3776 | 0.3719 |
| 415-430 nm | 0.3785 | 0.3717 | 0.3786 | 0.3733 | 0.3790 | 0.3775 |
| 430-445 nm | 0.3789 | 0.3735 | 0.3801 | 0.3778 | 0.3783 | 0.3748 |
| 445-455 nm | 0.3781 | 0.3719 | 0.3779 | 0.3708 | 0.3795 | 0.3803 |
| 455-465 nm | 0.3806 | 0.3801 | 0.3805 | 0.3788 | 0.3802 | 0.3844 |
| 465-480 nm | 0.3803 | 0.3785 | 0.3793 | 0.3755 | 0.3812 | 0.3872 |
| average values | 0.37914 | 0.37474 | 0.37918 | 0.37496 | 0.37864 | 0.37651 |
| range | 0.0025 | 0.0084 | 0.0026 | 0.0080 | 0.0047 | 0.0203 |
| standard deviations | 0.00089 | 0.00309 | 0.00092 | 0.00278 | 0.00164 | 0.00720 |

TABLE 6

Experimental Measurements on Chromaticity Distribution (light wavelength conversion members 10'-13' + LED chips having a wavelength from 380 nm to 480 nm)

| emitting wavelengths from chips | wavelength conversion members | | | | | | | |
|---|---|---|---|---|---|---|---|---|
| | 10' | | 11' | | 12' | | 13' | |
| | x | y | x | y | x | y | x | y |
| 380-395 nm | 0.3762 | 0.3666 | 0.3771 | 0.3703 | 0.3798 | 0.3764 | 0.3763 | 0.3647 |
| 395-405 nm | 0.3768 | 0.3695 | 0.3768 | 0.3694 | 0.3787 | 0.3733 | 0.3770 | 0.3686 |
| 405-415 nm | 0.3775 | 0.3724 | 0.3776 | 0.3719 | 0.3791 | 0.3747 | 0.3777 | 0.3725 |
| 415-430 nm | 0.3789 | 0.3778 | 0.3790 | 0.3780 | 0.3783 | 0.3708 | 0.3795 | 0.3797 |
| 430-445 nm | 0.3783 | 0.3752 | 0.3784 | 0.3752 | 0.3811 | 0.3819 | 0.3785 | 0.3761 |
| 445-455 nm | 0.3796 | 0.3814 | 0.3797 | 0.3810 | 0.3779 | 0.3684 | 0.3803 | 0.3832 |
| 455-465 nm | 0.3807 | 0.3849 | 0.3805 | 0.3841 | 0.3807 | 0.3799 | 0.3809 | 0.3869 |
| 465-480 nm | 0.3813 | 0.3894 | 0.3780 | 0.3734 | 0.3803 | 0.3787 | 0.3818 | 0.3911 |
| average values | 0.37866 | 0.37715 | 0.37840 | 0.37541 | 0.37949 | 0.37550 | 0.37900 | 0.37786 |
| range | 0.0051 | 0.0228 | 0.0037 | 0.0147 | 0.0033 | 0.0135 | 0.0055 | 0.0264 |
| Standard deviations | 0.00182 | 0.00779 | 0.00127 | 0.00524 | 0.00118 | 0.00462 | 0.00195 | 0.00909 |

TABLE 7

Experimental Measurements on Chromaticity Distribution (light wavelength conversion members 1-3 + LED chips having a wavelength from 400 nm to 465 nm)

| emitting wavelengths from chips | wavelength conversion members | | | | | |
|---|---|---|---|---|---|---|
| | 1 | | 2 | | 3 | |
| | x | y | x | y | x | y |
| 400-408 nm | 0.3761 | 0.3626 | 0.375 | 0.3593 | 0.376 | 0.3605 |
| 408-416 nm | 0.3767 | 0.3661 | 0.3767 | 0.3661 | 0.3777 | 0.3692 |
| 416-424 nm | 0.3776 | 0.3716 | 0.3769 | 0.3754 | 0.3744 | 0.3576 |
| 424-432 nm | 0.3795 | 0.3784 | 0.3794 | 0.3755 | 0.3816 | 0.3827 |
| 432-440 nm | 0.3783 | 0.3746 | 0.3784 | 0.3755 | 0.3795 | 0.3746 |
| 440-448 nm | 0.3806 | 0.3834 | 0.3812 | 0.3858 | 0.386 | 0.4018 |
| 448-456 nm | 0.3812 | 0.3885 | 0.3835 | 0.3911 | 0.3842 | 0.3926 |
| 456-465 nm | 0.3826 | 0.3926 | 0.3847 | 0.3983 | 0.3851 | 0.3983 |
| average values | 0.37907 | 0.37721 | 0.37948 | 0.37838 | 0.38055 | 0.37964 |
| range | 0.0065 | 0.03 | 0.0097 | 0.039 | 0.0116 | 0.0442 |
| standard deviations | 0.00229 | 0.01055 | 0.00342 | 0.01284 | 0.00435 | 0.01692 |

TABLE 8

Experimental Measurements on Chromaticity Distribution (light wavelength conversion members 4-6 + LED chips having a wavelength from 400 nm to 465 nm)

| emitting wavelengths from chips | wavelength conversion members | | | | | |
|---|---|---|---|---|---|---|
| | 4 | | 5 | | 6 | |
| | x | y | x | y | x | y |
| 400-408 nm | 0.3754 | 0.3621 | 0.3797 | 0.3768 | 0.3791 | 0.3743 |
| 408-416 nm | 0.3775 | 0.3678 | 0.3802 | 0.3776 | 0.379 | 0.3726 |
| 416-424 nm | 0.3789 | 0.3745 | 0.3783 | 0.3716 | 0.3792 | 0.3733 |
| 424-432 nm | 0.3791 | 0.3755 | 0.3781 | 0.3702 | 0.3791 | 0.3732 |
| 432-440 nm | 0.3785 | 0.3765 | 0.3789 | 0.374 | 0.3791 | 0.3734 |
| 440-448 nm | 0.3811 | 0.3872 | 0.3786 | 0.3729 | 0.378 | 0.372 |
| 448-456 nm | 0.3854 | 0.3982 | 0.3808 | 0.3801 | 0.3804 | 0.3796 |
| 456-465 nm | 0.3794 | 0.3774 | 0.3793 | 0.3754 | 0.3808 | 0.3792 |
| average values | 0.37941 | 0.3774 | 0.37923 | 0.37482 | 0.37934 | 0.3747 |
| range | 0.01 | 0.0361 | 0.0027 | 0.0099 | 0.0028 | 0.0076 |
| standard deviations | 0.00292 | 0.01113 | 0.00095 | 0.00329 | 0.00087 | 0.00298 |

TABLE 9

Experimental Measurements on Chromaticity Distribution (light wavelength conversion members 7-9 + LED chips having a wavelength from 400 nm to 465 nm)

| emitting wavelengths from chips | wavelength conversion members | | | | | |
|---|---|---|---|---|---|---|
| | 7 | | 8 | | 9 | |
| | x | y | x | y | x | y |
| 400-408 nm | 0.3794 | 0.3756 | 0.3797 | 0.3768 | 0.3765 | 0.3669 |
| 408-416 nm | 0.3787 | 0.373 | 0.3784 | 0.3725 | 0.3769 | 0.3692 |
| 416-424 nm | 0.3787 | 0.3737 | 0.3789 | 0.3742 | 0.3776 | 0.3718 |
| 424-432 nm | 0.3786 | 0.3717 | 0.3786 | 0.3733 | 0.379 | 0.3776 |
| 432-440 nm | 0.3788 | 0.3734 | 0.3801 | 0.3776 | 0.3784 | 0.375 |
| 440-448 nm | 0.3781 | 0.3721 | 0.3779 | 0.3708 | 0.3795 | 0.3808 |
| 448-456 nm | 0.3806 | 0.3799 | 0.3805 | 0.3785 | 0.3803 | 0.3849 |
| 456-465 nm | 0.3803 | 0.3787 | 0.3793 | 0.3754 | 0.3811 | 0.3874 |
| average values | 0.37915 | 0.37476 | 0.37918 | 0.37489 | 0.37864 | 0.37668 |
| range | 0.0025 | 0.0082 | 0.0026 | 0.0077 | 0.0046 | 0.0205 |
| standard deviations | 0.00088 | 0.00305 | 0.00089 | 0.00266 | 0.00163 | 0.00735 |

TABLE 10

Experimental Measurements on Chromaticity Distribution (light wavelength conversion members 10-13 + LED chips having a wavelength from 400 nm to 465 nm)

| emitting wavelengths from chips | wavelength conversion members | | | | | | | |
|---|---|---|---|---|---|---|---|---|
| | 10 | | 11 | | 12 | | 13 | |
| | x | y | x | y | x | y | x | y |
| 400-408 nm | 0.3762 | 0.3665 | 0.3771 | 0.3703 | 0.3798 | 0.3761 | 0.3763 | 0.3647 |
| 408-416 nm | 0.3768 | 0.3693 | 0.3769 | 0.3692 | 0.3787 | 0.373 | 0.377 | 0.3688 |
| 416-424 nm | 0.3776 | 0.372 | 0.3776 | 0.3718 | 0.3791 | 0.3744 | 0.3777 | 0.3722 |
| 424-432 nm | 0.379 | 0.3782 | 0.379 | 0.3778 | 0.3783 | 0.3708 | 0.3796 | 0.3797 |
| 432-440 nm | 0.3783 | 0.3751 | 0.3784 | 0.3751 | 0.3811 | 0.3817 | 0.3785 | 0.3761 |
| 440-448 nm | 0.3797 | 0.3819 | 0.3798 | 0.3813 | 0.3779 | 0.3684 | 0.3803 | 0.3832 |
| 448-456 nm | 0.3807 | 0.3847 | 0.3805 | 0.3843 | 0.3806 | 0.3799 | 0.3809 | 0.3871 |
| 456-465 nm | 0.3813 | 0.3894 | 0.3781 | 0.3735 | 0.3803 | 0.3787 | 0.3818 | 0.3911 |
| average values | 0.3787 | 0.37715 | 0.37841 | 0.37541 | 0.37947 | 0.37539 | 0.379 | 0.37785 |
| range | 0.0051 | 0.0229 | 0.0036 | 0.0151 | 0.0032 | 0.0133 | 0.0055 | 0.0264 |
| standard deviations | 0.00181 | 0.00789 | 0.00127 | 0.00538 | 0.00117 | 0.0046 | 0.00197 | 0.00915 |

As can be seen from the above tables, light wavelength conversion members 1', 2', 3' and 4' and 1, 2, 3 and 4 are existing light conversion filters, when these light wavelength conversion members are applied onto LED chips to manufacture LED light sources, the chromaticity distribution of the light emitted from the LED light sources has relatively large range values and standard deviations. Referring to FIG. 9, the dispersion degree of the chromaticity distribution is relatively large. When light wavelength conversion members 5'-13' and 5-13 are used to obtain LED light sources, the range values and standard deviations of the chromaticity distribution are reduced almost by 30% or more and 40% or more, respectively. Particularly, when the light wavelength conversion members 5', 6', 7' and 8' and 5, 6, 7 and 8 are used to manufacture LED light sources, the range values and standard deviations of the chromaticity of the light emitted from the LED light sources are reduced by 40% or more and 60% or more, respectively, as compared with the range values and standard deviations of the control group (light wavelength member 1). It indicates that the dispersion degree of the chromaticity distribution of the light emitted from the light sources is relatively small, and the product yield of the LED light sources is effectively increased. FIGS. 9 and 10 clearly show such difference.

The light wavelength conversion member 6 (when light wavelength conversion member 6 is used, the range values and standard deviations are reduced by 50% or more and 60% or more, respectively, as compared with the control group in which any one of light wavelength conversion members 1-4 is used to obtain a series of LED light sources) in the above tables is selected, and the weight ratio of phosphors in the light wavelength conversion member 6 is adjusted. Then, the same experiment as that in above Tables 7 to 10 is performed, and results are listed in the following tables.

TABLE 11

Experimental Measurements on Chromaticity Distribution (light wavelength conversion member with modified weight ratio of phosphors + blue LED chips)

| emitting wavelengths from chips | wavelength conversion member 6 weight ratio of phosphors ($Lu_3Al_5O_{12}$:Ce and $Sr_3SiO_5$:Eu) | | | | | | | |
|---|---|---|---|---|---|---|---|---|
| | 100:1 | | 10:1 | | 3:1 | | 2:1 | |
| 400-408 nm | 0.3769 | 0.3686 | 0.3769 | 0.3680 | 0.3768 | 0.3680 | 0.3766 | 0.3677 |
| 408-416 nm | 0.3773 | 0.3698 | 0.3773 | 0.3697 | 0.3772 | 0.3701 | 0.3772 | 0.3695 |
| 416-424 nm | 0.3777 | 0.3715 | 0.3777 | 0.3712 | 0.3777 | 0.3716 | 0.3776 | 0.3718 |
| 424-432 nm | 0.3785 | 0.3748 | 0.3786 | 0.3748 | 0.3790 | 0.3769 | 0.3789 | 0.3774 |
| 432-440 nm | 0.3780 | 0.3729 | 0.3780 | 0.3729 | 0.3782 | 0.3735 | 0.3780 | 0.3737 |
| 440-448 nm | 0.3789 | 0.3764 | 0.3791 | 0.3767 | 0.3793 | 0.3778 | 0.3794 | 0.3800 |
| 448-456 nm | 0.3794 | 0.3777 | 0.3795 | 0.3780 | 0.3795 | 0.3793 | 0.3799 | 0.3828 |
| 456-465 nm | 0.3797 | 0.3790 | 0.3798 | 0.3797 | 0.3799 | 0.3806 | 0.3806 | 0.3860 |
| average values | 0.37831 | 0.37386 | 0.37837 | 0.37387 | 0.37845 | 0.37471 | 0.37851 | 0.37612 |
| standard deviations | 0.00100 | 0.00375 | 0.00105 | 0.00411 | 0.00114 | 0.00457 | 0.00141 | 0.00654 |

TABLE 12

Experimental Measurements on Chromaticity Distribution (light wavelength conversion member with modified weight ratio of phosphors + blue LED chips)

| emitting wavelengths from chips | wavelength conversion member 6 weight ratio of phosphors ($Lu_3Al_5O_{12}$:Ce and $Sr_3SiO_5$:Eu) | | | | | | | |
|---|---|---|---|---|---|---|---|---|
| | 1:2 | | 1:3 | | 1:10 | | 1:100 | |
| 400-408 nm | 0.3764 | 0.3660 | 0.3763 | 0.3650 | 0.3759 | 0.3630 | 0.3759 | 0.3630 |
| 408-416 nm | 0.3773 | 0.3692 | 0.3770 | 0.3680 | 0.3766 | 0.3658 | 0.3766 | 0.3658 |
| 416-424 nm | 0.3780 | 0.3714 | 0.3779 | 0.3711 | 0.3776 | 0.3692 | 0.3775 | 0.3686 |
| 424-432 nm | 0.3793 | 0.3782 | 0.3791 | 0.3767 | 0.3788 | 0.3750 | 0.3787 | 0.3748 |
| 432-440 nm | 0.3787 | 0.3751 | 0.3783 | 0.3737 | 0.3782 | 0.3720 | 0.3781 | 0.3720 |
| 440-448 nm | 0.3797 | 0.3804 | 0.3794 | 0.3795 | 0.3793 | 0.3778 | 0.3794 | 0.3777 |
| 448-456 nm | 0.3801 | 0.3834 | 0.3800 | 0.3823 | 0.3801 | 0.3812 | 0.3802 | 0.3813 |
| 456-465 nm | 0.3807 | 0.3864 | 0.3809 | 0.3862 | 0.3811 | 0.3859 | 0.3812 | 0.3863 |
| average values | 0.37878 | 0.37625 | 0.37861 | 0.37530 | 0.37843 | 0.37370 | 0.37843 | 0.37368 |
| standard values | 0.00146 | 0.00713 | 0.00154 | 0.00723 | 0.00173 | 0.00777 | 0.00180 | 0.00790 |

Second Embodiment—Experimental Measurements on Color Temperature, Light Efficiency, CRI Distribution Using the methods and light wavelength conversion members in the present invention may further reduce the color temperature distribution, the light efficiency distribution and CRI distribution of the light emitted from the manufactured LED light sources. Thus, the ratio of finalized LED light sources falling into the target light property level is effectively increased, and product yield of LED light sources is improved.

In the second embodiment, the light wavelength conversion members 7 and 9 in the first embodiment are applied onto LED chips to manufacture LED light sources. According to GB/T 24982-2010 "Rare Earth Yellow Phosphor for White LED Lamps", the color temperature distribution, the light efficiency distribution and the CRI distribution of the light emitted from the obtained LED light sources are measured. The measurement results as compared with the color temperature distribution, the light efficiency distribution and the CRI distribution of the light emitted from the series of LED light sources obtained using the light wavelength conversion member 2 in the first embodiment are listed in the following tables.

TABLE 13

Optical performances of the light emitted from the LED light sources manufactured using the light wavelength conversion member 7

| emitting wavelengths from chips | wavelength conversion members | | | | | |
|---|---|---|---|---|---|---|
| | color temperature | | light efficiency | | CRI | |
| | 2 | 7 | 2 | 7 | 2 | 7 |
| 400-408 nm | 4029 | 4020 | 149.0 | 148.4 | 71.0 | 78.5 |
| 408-416 nm | 4029 | 4021 | 153.1 | 149.8 | 74.5 | 78.0 |
| 416-424 nm | 4087 | 4026 | 145.9 | 143.8 | 74.5 | 79.0 |
| 424-432 nm | 4019 | 4015 | 156.1 | 149.9 | 75.0 | 79.0 |
| 432-440 nm | 4046 | 4021 | 150.8 | 146.9 | 75.5 | 81.0 |
| 440-448 nm | 4039 | 4031 | 149.9 | 146.6 | 77.0 | 81.5 |
| 448-456 nm | 4014 | 4016 | 155.5 | 148.1 | 77.5 | 82.5 |
| 456-465 nm | 4029 | 4016 | 150.9 | 147.3 | 79.2 | 79.1 |
| average values | 4036.5 | 4020.8 | 151.40 | 147.60 | 75.53 | 79.83 |
| range | 73 | 16 | 10.2 | 6.1 | 8.2 | 4.5 |
| standard deviation | 22.8 | 5.5 | 3.39 | 1.97 | 2.46 | 1.62 |

TABLE 14

Optical performances of the light emitted from the LED light sources manufactured using the light wavelength conversion member 9

| emitting wavelengths from chips | wavelength conversion members | | | | | |
|---|---|---|---|---|---|---|
| | color temperature | | light efficiency | | CRI | |
| | 2 | 9 | 2 | 9 | 2 | 9 |
| 400-408 nm | 4029 | 4040 | 149.0 | 148.1 | 71.0 | 78.4 |
| 408-416 nm | 4029 | 4045 | 153.1 | 149.1 | 74.5 | 78.3 |
| 416-424 nm | 4087 | 4043 | 145.9 | 145.3 | 74.5 | 79.2 |
| 424-432 nm | 4019 | 4044 | 156.1 | 149.6 | 75.0 | 79.1 |
| 432-440 nm | 4046 | 4051 | 150.8 | 147.2 | 75.5 | 80.9 |
| 440-448 nm | 4039 | 4053 | 149.9 | 147.3 | 77.0 | 81.2 |
| 448-456 nm | 4014 | 4052 | 155.5 | 148.1 | 77.5 | 82.1 |
| 456-465 nm | 4029 | 4054 | 150.9 | 147.4 | 79.2 | 79.3 |
| average values | 4036.5 | 4047.8 | 151.40 | 147.77 | 75.53 | 79.80 |

TABLE 14-continued

Optical performances of the light emitted from the LED light sources manufactured using the light wavelength conversion member 9

| emitting wavelengths from chips | wavelength conversion members | | | | | |
|---|---|---|---|---|---|---|
| | color temperature | | light efficiency | | CRI | |
| | 2 | 9 | 2 | 9 | 2 | 9 |
| range | 73 | 14 | 10.2 | 4.3 | 8.2 | 3.8 |
| standard deviations | 22.8 | 5.3 | 3.39 | 1.33 | 2.46 | 1.42 |

The preferable embodiments of the present invention are described above. It shall be appreciated that the above preferable embodiments are not for limiting the present invention, and the protection scope of the present invention shall be defined by the appended claims. One of ordinary skill in this art can make various improvements and modifications without departing form the spirit and scope of the present invention, and such improvements and modifications shall be deemed as falling within the protection scope of the present invention.

What is claimed is:

1. A method for improving yield of an LED light source, comprising:
    packaging an LED light source, which comprises an LED chip, a first light wavelength conversion member and a second light conversion member, wherein an initial light emitted from the LED chip is converted by the first light conversion member and the second light wavelength conversion member to a secondary light; and
    emitting the secondary light from the LED light source, wherein the second light wavelength conversion member comprises at least two light conversion filters having different light excitation properties; and
    wherein when the at least two light conversion filters having different light excitation properties are excited by light emitted from the LED chip, luminous intensity of light converted by the at least two light conversion filters shows opposing change tendencies as the wavelength of the light emitted from the LED chip changes from short to long.

2. The method for improving yield of an LED light source according to claim 1, wherein the at least two light conversion filters having different light excitation properties are a light conversion filter having a forward excitation property and a light conversion filter having a reverse excitation property; wherein when the light conversion filter having the forward excitation property is excited by the light emitted from the LED chip, luminous intensity of light converted by the light conversion filter having the forward excitation property shows a change tendency from weak to strong as the wavelength of the light emitted from the LED chip changes from short to long; and wherein when the light conversion filter having the reverse excitation property is excited by the light emitted from the LED chip, luminous intensity of light converted by the light conversion filter having the reverse excitation property shows a change tendency from strong to weak as the wavelength of the light emitted from the LED chip changes from short to long.

3. The method for improving yield of an LED light source according to claim 2, wherein when the light conversion filter having the forward excitation property is excited by the light emitted from the LED chip, the luminous intensity of light converted by the light conversion filter having the forward excitation property shows a change tendency like a straight line or a curved line from weak to strong as the wavelength of the light emitted from the LED chip rises from 380 nm to 480 nm, the straight line has a slope of K1, K1>0, and the curved line has a slope of K2, K2>0.

4. The method for improving yield of an LED light source according to claim 2, wherein when the light conversion filter having the forward excitation property is excited by the light emitted from the LED chip, the luminous intensity of the light converted by the light conversion filter having the forward excitation property shows a change tendency like a straight line or a curved line from weak to strong as the wavelength of the light emitted from the LED chip rises from 400 nm to 465 nm, the straight line has a slope of K1, K1>0, and the curved line has a slope of K2, K2>0.

5. The method for improving yield of an LED light source according to claim 3, wherein the slope K1 of the straight line meets a condition: $0.1 \leq K1 \leq 10$, the slope K2 of the curved line is increased or reduced gradually and K2 meets a condition: $0.1 \leq K2 \leq 10$.

6. The method for improving yield of an LED light source according to claim 2, wherein when the light conversion filter having the reverse excitation property is excited by the light emitted from the LED chip, the luminous intensity of light converted by the light conversion filter having the reverse excitation property shows a change tendency like a straight line or a curved line from strong to weak as the wavelength of the light emitted from the LED chip rises from 380 nm to 480 nm, the straight line has a slope of K1', K1'<0, and the curved line has a slope of K2', K2'<0.

7. The method for improving yield of an LED light source according to claim 2, wherein when the light conversion filter having the reverse excitation property is excited by the light emitted from the LED chip, the luminous intensity of the light converted by the light conversion filter having the reverse excitation property shows a change tendency like a straight line or a curved line from strong to weak as the wavelength of the light emitted from the LED chip rises from 400 nm to 465 nm, the straight line has a slope of K1', K1'<0, and the curved line has a slope of K2', K2'<0.

8. The method for improving yield of an LED light source according to claim 6, wherein the slope K1' of the straight line meets a condition: $-10 \leq K1' \leq -0.1$, the slope K2' of the curved line is increased or reduced gradually and K2' meets a condition: $-10 \leq K2' \leq -0.1$.

9. The method for improving yield of an LED light source according to claim 2, wherein a ratio α between weight of the light conversion filter having the forward excitation property and weight of the light conversion filter having the reverse excitation property meets a condition: $1:100 \leq \alpha \leq 100:1$.

10. The method for improving yield of an LED light source according to claim 2, wherein when the light conversion filter having the forward excitation property is excited by the light emitted from the LED chip, the luminous intensity of the light converted by the light conversion filter having the forward excitation property shows a change tendency like a straight line or a curved line from weak to strong as the wavelength of the light emitted from the LED chip rises from 380 nm to 480 nm, the straight line has a slope of K1, $0.1 \leq K1 \leq 10$, and the curved line has a slope of K2 which is increased or reduced gradually, $0.1 \leq K2 \leq 10$; when the light conversion filter having the reverse excitation property is excited by the light emitted from the LED chip, the luminous intensity of the light converted by the light conversion filter having the forward excitation property shows a change tendency like a straight line or a curved line from strong to weak as the wavelength of the light emitted from the LED chip rises from 380 nm to 480 nm, the straight line has a slope of K1', $-10 \leq K1' \leq -0.1$, and the curved line has a slope of K2' which is increased or reduced gradually, $-10 \leq K2' \leq -0.1$; a ratio α between weight of the light conversion filter having the forward excitation property and weight of the light conversion filter having the reverse excitation property meets a condition: $1:10 \leq \alpha \leq 10:1$.

11. The method for improving yield of an LED light source according to claim 1, wherein in the LED light source, the second light wavelength conversion member is disposed on a surface of the LED chip, or is separated from the LED chip.

12. The method for improving yield of an LED light source according to claim 1, wherein the light conversion filters in the second light wavelength conversion member are mixed and then disposed on a surface of the LED chip, or are separated from the LED chip; or the light conversion filters in the second light wavelength conversion member are individually disposed on a surface of the LED chip, or are separated from the LED chip.

* * * * *